(12) United States Patent
Kuroda et al.

(10) Patent No.: US 7,473,518 B2
(45) Date of Patent: Jan. 6, 2009

(54) METHOD OF MANUFACTURING A DEVICE USING A NEAR-FIELD PHOTOMASK AND NEAR-FIELD LIGHT

(75) Inventors: Ryo Kuroda, Kanagawa (JP); Natsuhiko Mizutani, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 62 days.

(21) Appl. No.: 11/768,445

(22) Filed: Jun. 26, 2007

(65) Prior Publication Data
US 2007/0248917 A1    Oct. 25, 2007

Related U.S. Application Data

(62) Division of application No. 10/648,317, filed on Aug. 27, 2003, now Pat. No. 7,262,828.

(30) Foreign Application Priority Data
Sep. 6, 2002    (JP)    ............... 2002-261502

(51) Int. Cl.
G03F 7/40    (2006.01)
G03F 7/20    (2006.01)
(52) U.S. Cl. .................. 430/313; 430/319; 430/321
(58) Field of Classification Search .......... 430/313, 430/319, 321
See application file for complete search history.

(56) References Cited

U.S. PATENT DOCUMENTS 6,171,730 B1    1/2001    Kuroda et al. .................. 430/5
6,187,482 B1    2/2001    Kuroda et al. .................. 430/5
6,236,033 B1    5/2001    Ebbesen et al. ............. 250/216
6,983,444 B2    1/2006    Yang ............................. 716/19
2001/0046719 A1    11/2001    Yamaguchi et al. ........... 438/11
2002/0071106 A1    6/2002    Yano et al. ..................... 355/53
2005/0026047 A1    2/2005    Yang ............................... 430/5

FOREIGN PATENT DOCUMENTS

JP    2000-112116    4/2000

OTHER PUBLICATIONS

Alkaisi, M. M., et al., "Sub-diffraction-limited patterning using evanescent near-field optical lithography", (1999) Applied Physics Letters, vol. 75, No. 22. pp. 3560-3562.

*Primary Examiner*—Mark F Huff
*Assistant Examiner*—John Ruggles
(74) *Attorney, Agent, or Firm*—Fitzpatrick, Cella, Harper & Scinto

(57) ABSTRACT

A method of manufacturing a device includes the steps of (i) providing a near-field photomask including a light shield film for constituting a light shield portion and openings formed in the light shield film, wherein the openings include two or more parallel first slit openings lengthening in a first direction and a second slit opening lengthening in a second direction that is perpendicular to the first directions, wherein the second slit opening interlinks the first slit openings, (ii) forming a photoresist layer on a substrate, (iii) exposing the photoresist layer to near-field light through the near-field photomask using polarized exposure light having an electrical field component parallel to the first direction, to form a latent image on the photoresist only in discrete regions at which the second slit opening crosses the light shield portion, (iv) forming a pattern of the photoresist layer based on the latent image, and (v) etching a surface of the substrate based on the pattern.

5 Claims, 13 Drawing Sheets

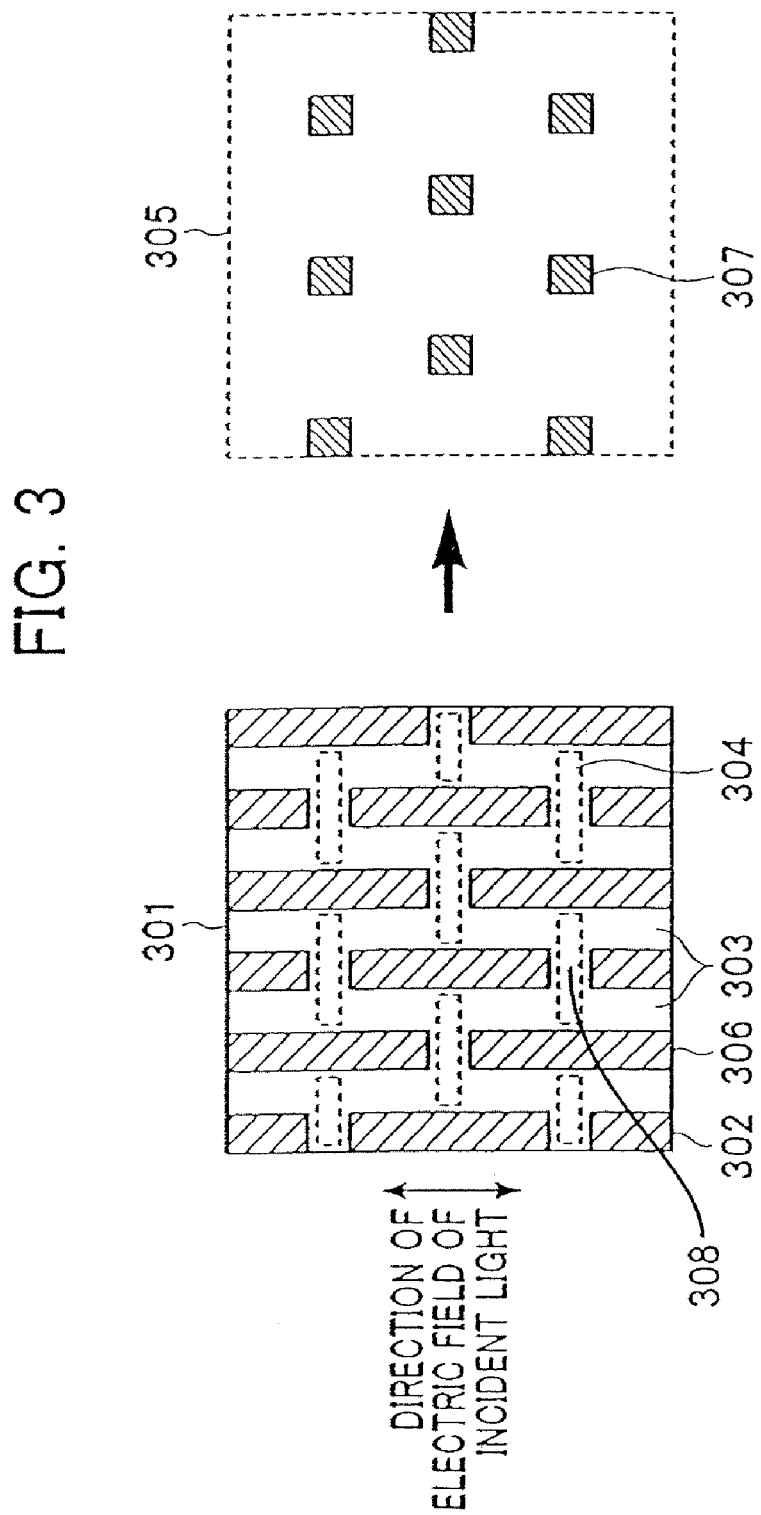

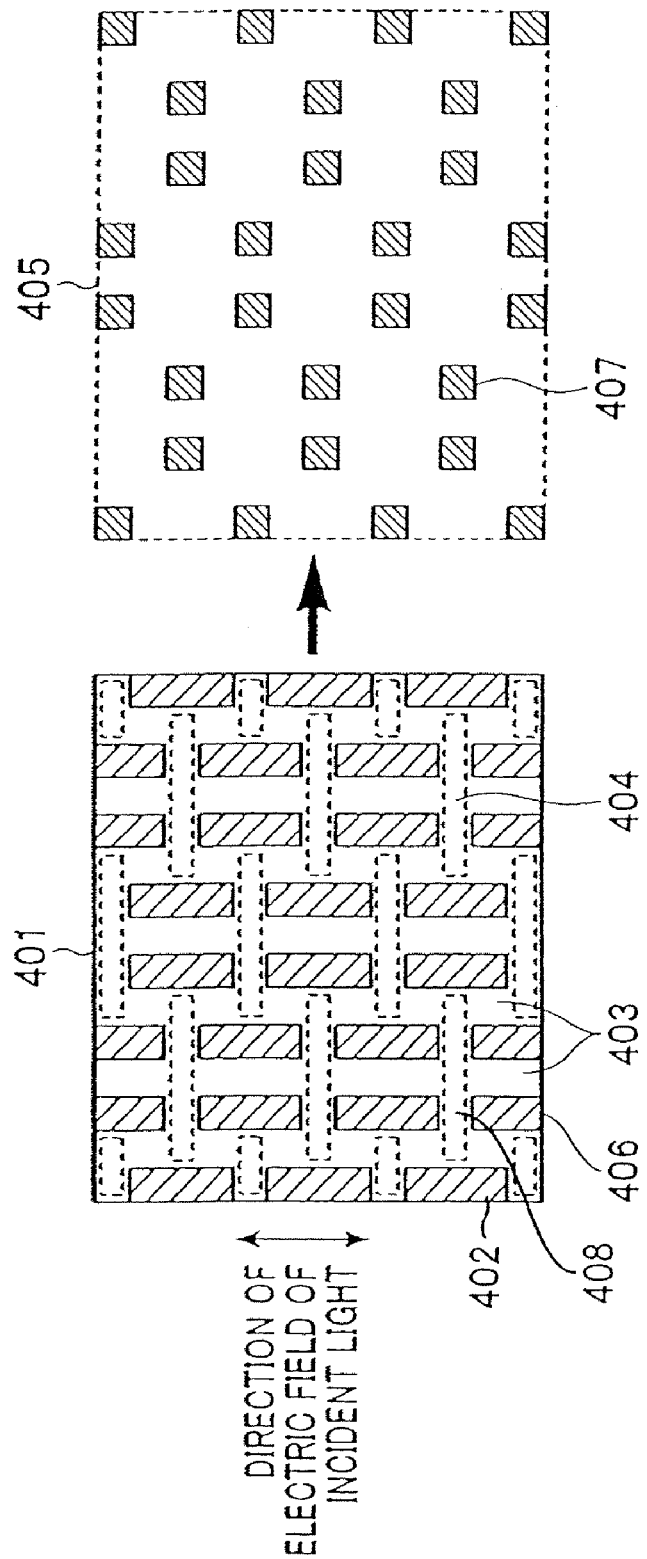

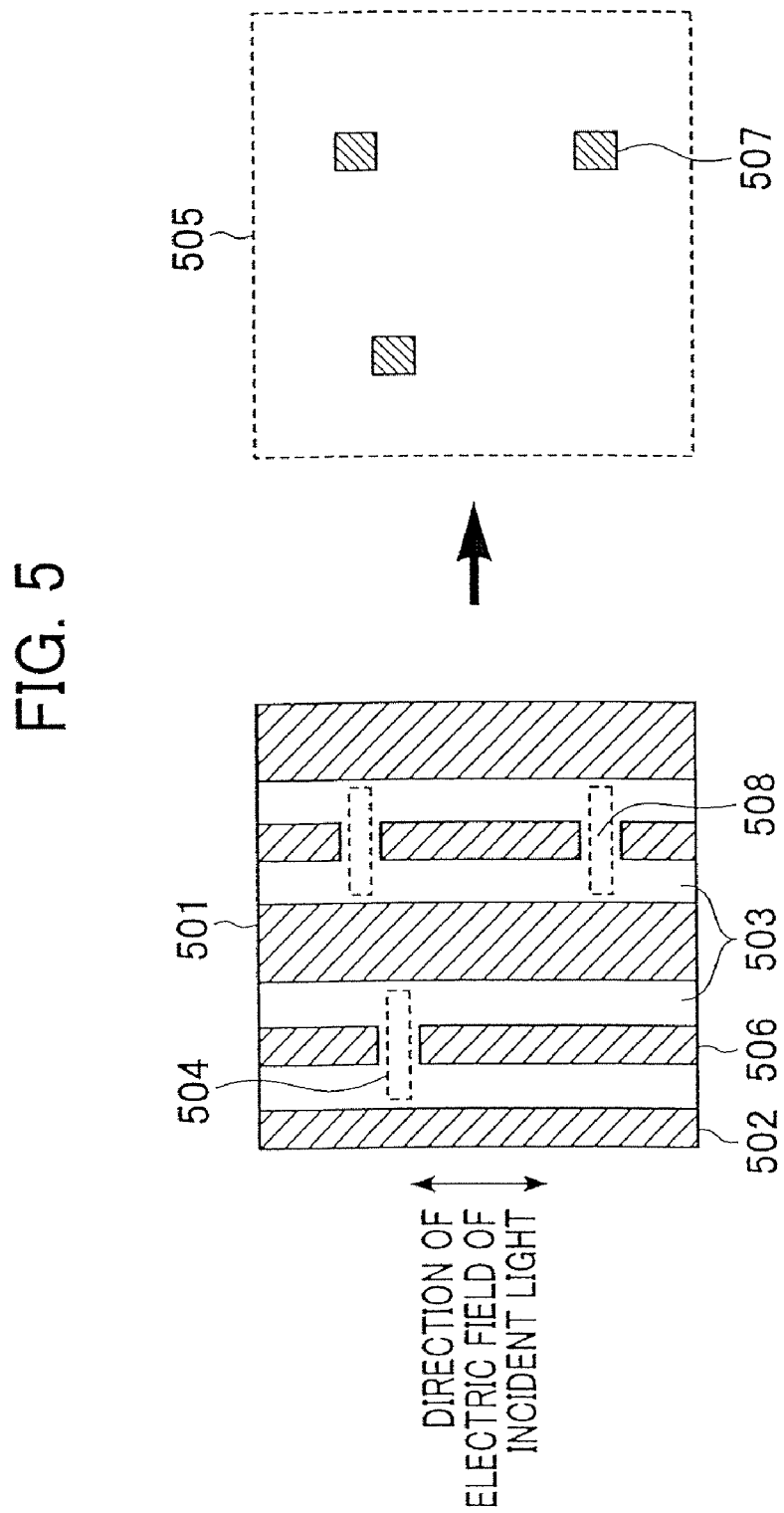

ETCHED AREA ON REAR SIDE

SECTIONAL VIEW

PLAN VIEW OF ACTIVE LAYER PORTION

PERSPECTIVE VIEW

SECTIONAL VIEW

PERSPECTIVE VIEW

SECTIONAL VIEW

METHOD OF MANUFACTURING A DEVICE USING A NEAR-FIELD PHOTOMASK AND NEAR-FIELD LIGHT

This application is a divisional application of U.S. patent application Ser. No. 10/648,317, filed Aug. 27, 2003 now U.S. Pat. No. 7,262,828 issued Aug. 28, 2007. This application also claims priority from Japanese Patent Application No. 2002-261502, filed Sep. 6, 2002, which is hereby incorporated by reference.

BACKGROUND OF THE INVENTION

1. Field of the Invention

The present invention relates to an exposure apparatus for forming a micropattern, such as that required in a quantum dot device and a sub-wavelength structured device, and also relates to a mask for use in the exposure apparatus.

2. Description of the Related Art

With the increasing capacity of semiconductor memories and the trend toward higher speeds and higher packing density of CPU processors, it is essential to realize a finer microstructure with photolithography. The limit in micromachining achievable with a photolithography apparatus is generally on the order of about the wavelength of light used.

For that reason, the wavelength of light used in the photolithography apparatus has been shortened. At present, a near ultraviolet laser is employed as a light source and micromachining on the order of 0.1 µm is realized.

Thus, photolithography capable of providing a finer microstructure has been developed. To carry out the micromachining on the order of not larger than 0.1 µm, however, problems arise that must be solved, e.g., using a laser of shorter wavelength and developing a lens in such a wavelength range.

Meanwhile, a micromachining apparatus has been proposed in which a scanning near-field optical microscope (abbreviated to "SNOM" hereinafter) is employed as means for enabling micromachining on the order of not larger than 0.1 µm to be performed with the use of light. In the proposed apparatus, local exposure beyond a limit imposed by the wavelength of light is carried out on a resist by using near-field light projecting from a micro-opening with a size of not larger than 100 nm, for example.

In any photolithography apparatuses using the SNOM, however, the micromachining is performed in a similar manner to drawing with a single stroke by employing one (or several) optical probe (probes). Hence, a problem arises in that throughput is not improved.

As one method for overcoming such a problem, a near-field mask exposure technique is proposed in which light illuminates a rear surface of a photomask prepared by forming a pattern of openings of not larger than 0.1 µm in a light shield film, and transferring a pattern of the photomask onto a resist by using near-field light projecting through the opening pattern (see U.S. Pat. No. 6,171,730). The invention disclosed in U.S. Pat. No. 6,171,730 is superior and provides a great contribution to the fields of photolithography and semiconductor production technology.

On the other hand, it has also been proposed to employ a mask pattern, which has dot openings 1001 arranged as shown in FIG. 10, when forming a dot pattern with exposure based on the near-field mask exposure mentioned above.

However, if the opening size is reduced to form a dot pattern of a smaller size, there arises a risk that the intensity of the near-field light generated from the opening is reduced and the time required for the exposure is prolonged, thus resulting in a reduced throughput of the micromachining apparatus.

SUMMARY OF THE INVENTION

To overcome the above-mentioned problems in the art, according to a first aspect, the present invention provides a near-field photomask made up of a light shield film and openings formed in the light shield film, the photomask being used to expose an exposure target with near-field light generated through the openings, wherein the openings formed in the light shield film comprise two or more parallel rows of first slit openings each having a width smaller than 100 nm, and a second slit opening having a width smaller than 100 nm and extending perpendicularly to the rows of first slit openings while interlinking at least two of the rows of first slit openings.

According to a second aspect, the present invention provides a near-field exposure apparatus comprising a near-field photomask according to the first aspect, a light illuminating unit for illuminating the near-field photomask with polarized light, which has an electrical field component parallel to the rows of first slit openings, and a unit for positioning the near-field photomask close to the exposure target up to a distance within the near-field region.

According to a third aspect, the present invention provides a dot pattern forming method including a step of forming a dot pattern by using the near-field exposure apparatus according to the second aspect. According to a fourth aspect, the present invention provides a device manufactured by using the near-field exposure apparatus according to the second aspect.

Thus, with the near-field photomask of the present invention, an opening pattern formed in the light shield film comprises two or more rows of first slit openings each having a width smaller than 100 nm and being parallel to the direction of an electrical field of incident light, and a second slit opening having a width smaller than 100 nm and extending perpendicularly to the direction of the electrical field of the incident light while interlinking at least two of the rows of first slit openings. It is therefore possible to increase the intensity of near-field light generated through the opening pattern, and to improve the throughput in the process using exposure. In addition, the cost of a device manufactured using the near-field photomask can be reduced.

Further objects, features and advantages of the present invention will become apparent from the following description of the preferred embodiments with reference to the attached drawings.

BRIEF DESCRIPTION OF THE DRAWINGS

FIG. 3 is an illustration showing a second embodiment of the near-field photomask according to the present invention.

FIG. 4 is an illustration showing a third embodiment of the near-field photomask according to the present invention.

FIG. 5 is an illustration showing a fourth embodiment of the near-field photomask according to the present invention.

DESCRIPTION OF THE PREFERRED EMBODIMENTS

Figure 1:
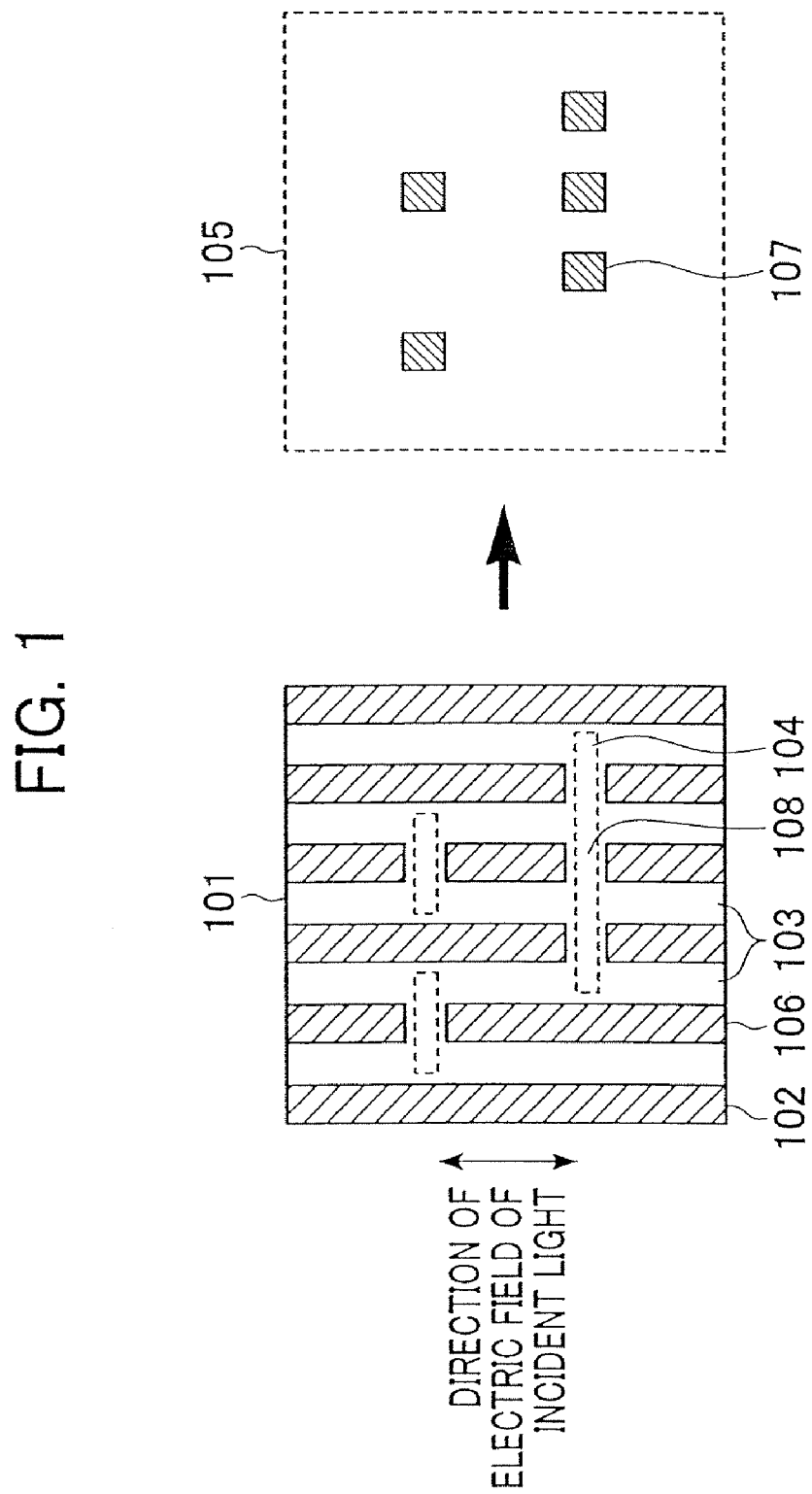
FIG. 1 is an illustration for explaining the principle of a near-field photomask according to the present invention.

As mentioned in the summary, the first aspect of the present invention resides in a near-field photomask made up of a light shield film and openings formed in the light shield film, the photomask being used to expose an exposure target with a near-field light generated through the openings, wherein the openings formed in the light shield film comprise two or more parallel rows of first slit openings each having a width smaller than 100 nm, and a second slit opening having a width smaller than 100 nm and extending perpendicularly to the rows of first slit openings while interlinking at least two of the rows of first slit openings.

The second aspect of the present invention resides in a near-field exposure apparatus comprising a near-field photomask according to the first aspect; a light illuminating unit for illuminating the near-field photomask with polarized light, which has an electrical field component parallel to the rows of first slit openings, and a unit for positioning the near-field photomask close to the exposure target up to a distance within a near-field region.

The third aspect of the present invention resides in a dot pattern forming method including a step of forming a dot pattern by using the near-field exposure apparatus according to the second aspect. The fourth aspect of the present invention resides in a device manufactured by using the near-field exposure apparatus according to the second aspect.

The present invention will be described below in more detail.

(Mask)

When light having a wavelength ranging from the visible to the near ultraviolet range illuminates a slit opening with a width of not larger than 100 nm, the intensity of generated near-field light is small if the direction of the electrical field of the incident light is parallel to the slit opening. In addition, when light having a wavelength ranging from the visible to the near ultraviolet range illuminates a slit opening with a width of not larger than 100 nm, the intensity of the generated near-field light is large if the direction of the electrical field of the incident light is perpendicular to the slit opening. This result is attributable to the larger intensity of the near-field light at edges of the slit opening perpendicular to the direction of the electrical field of the incident light than at edges of the slit opening parallel to the direction of the electrical field of the incident light.

Therefore, a latent image of a pattern of only the slit openings perpendicular to the direction of the electrical field of the incident light can be formed in a photoresist used in the near-field exposure. This effect can be achieved by adjusting the intensity of exposure light in two different ways. First, the intensity of the near-field light generated when the direction of the electrical field of the incident light is parallel to the slit openings is adjusted to be smaller than a threshold for the formation of the latent image. Second, the intensity of the near-field light generated when the direction of the electrical field of the incident light is perpendicular to the slit openings is adjusted to be larger than the threshold for the formation of the latent image. As a result, the near-field light generated by slit edges parallel to the electrical-field direction of the incident light forms no latent image on the photoresist, while the near-field light generated by slit edges perpendicular to the electrical-field direction of incident light forms a latent image on the photoresist.

As shown in FIG. 1, for example, rows of first slit openings 103 are formed in a light shield film 102 of a near-field photomask 101 parallel to the direction of the electrical field of the incident light, and second slit openings 104 are formed in the light shield film 102 perpendicularly to the direction of the electrical field of the incident light so as to interlink plural rows of the first slit openings 103.

For the sake of explanation, the second slit openings 104 are each shown in FIG. 1 as being demarcated by dotted lines and having an area slightly smaller than the actually defined opening. The second slit opening 104 may interlink two rows of the first slit openings 103 or, three or more rows of the first slit openings 103.

Numeral 105 in FIG. 1 shows a latent image pattern formed in the photoresist as a result of subjecting the photoresist to exposure light through the near-field photomask 101. As shown, a latent image is formed in each area of the near-field photomask 101 where a light shield portion 106 and the second slit opening 104 cross each other. Numeral 107 denotes the area where the latent image is formed. Such formation of the latent image is attributable to the fact that, as described above, the near-field light is intensified at edges of the slit opening perpendicular to the direction of the electrical field of the incident light more than at edges of the slit opening parallel to the direction of the electrical field of the incident light, and is attributable to the fact that there are no edges of the slit opening in the area where the row of first slit opening and the second slit opening cross each other.

The intensity of the near-field light generated in the area of the near-field photomask 101 where the light shield portion 106 and the second slit opening 104 cross each other, as described above, is larger than the intensity of near-field light generated from a single dot opening of the same size as the crossed area. The reason is that no light shield films exist in the vicinity around the crossed area in a direction perpendicular to the direction of the electrical field of the incident light and hence the shield effect developed by movements of electrons in the light shield film does not act upon the crossed area.

Figure 6A:
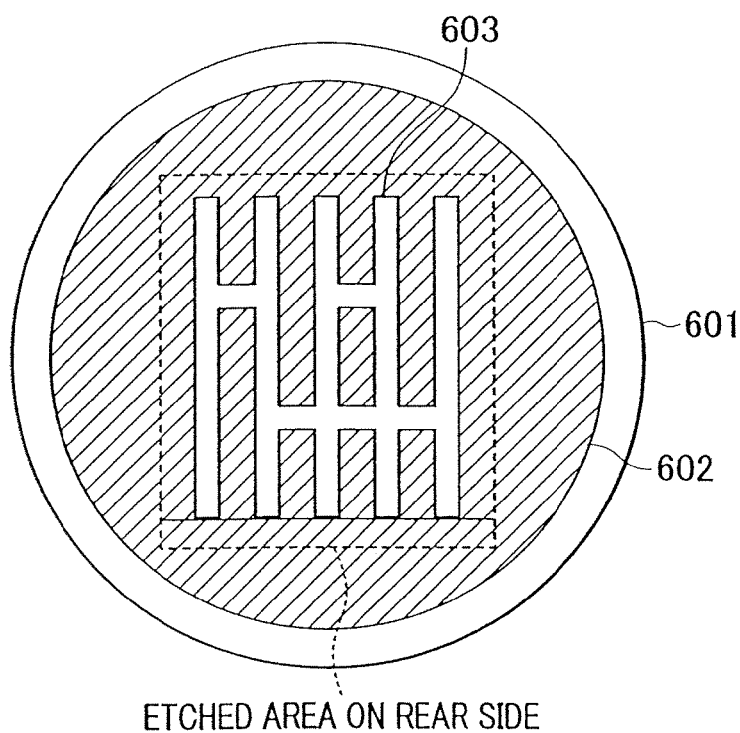
FIGS. 6A and 6B are a plan view and a sectional view, respectively, showing a construction of the near-field photomask.
Figure 6B:
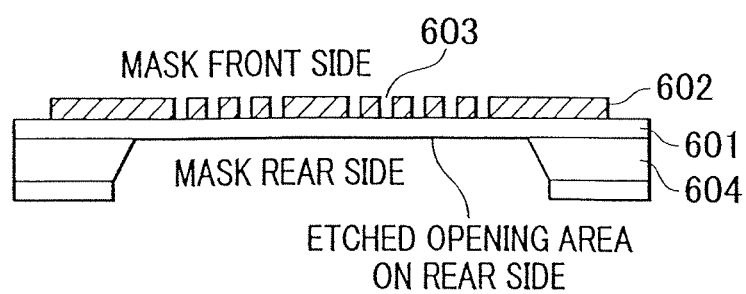

FIGS. 6A and 6B show details of one example of a construction of the near-field photomask of the present invention. FIG. 6A is a plan view of the photomask, looking at the mask front side, while FIG. 6B is a sectional view of the near-field photomask.

As shown in FIGS. 6A and 6B, the near-field photomask is made up of a mask base 601 formed of a thin film with a thickness from 0.1 to 1 µm and transparent to a light of the exposure wavelength, and a metal thin film 602 having a thickness from about 5 to 100 nm and formed on the mask base 601. A micro-opening pattern 603 with a width of not larger than 100 nm is formed in the metal thin film 602. The mask base 601 is supported on a substrate 604.

If the mask base 601 has a smaller thickness, it is more easily susceptible to elastic deformation and is able to elastically deform more closely following smaller irregularities and undulations in both the surfaces of the resist and the substrate, thereby improving closeness. However, if the thickness of the mask base 601 is too small with respect to the exposure area, trouble may occur in that the strength required for the mask base 601 to serve as a mask becomes deficient, or the mask base 601 may be broken by attraction forces acting between the resist and the substrate when peeling off the mask base 601 after the steps of closely positioning and exposing the resist.

From the viewpoint of the above-described mechanical characteristics, in a preferred embodiment, the thickness of the mask base 601 is preferably in the range of 0.1 to 100 μm.

(Exposure Apparatus)

One example of an exposure apparatus using the near-field photomask of the present invention will be described below.

Figure 7:
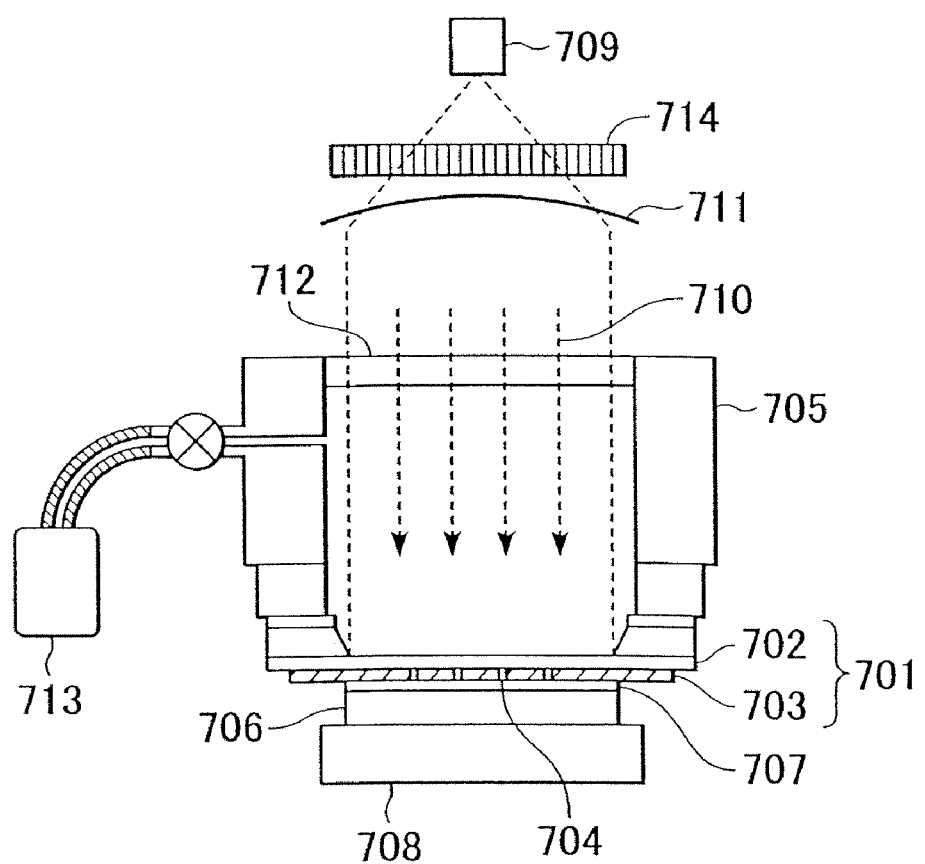
FIG. 7 is a schematic view showing a construction of a near-field photomask exposure apparatus.

FIG. 7 shows a construction of a near-field photomask exposure apparatus using the near-field photomask of the present invention. Referring to FIG. 7, numeral 701 denotes a near-field photomask that is employed as a mask for exposure in the present invention. The near-field photomask 701 is made up of a mask base 702 and a metal thin film 703. The metal thin film 703 is formed on the mask base 702, and a micro-opening pattern 704 is formed in the metal thin film 703.

The near-field photomask 701 is disposed such that the front side (lower side in FIG. 7) is positioned outside a pressure adjusting vessel 705 and the rear side (upper side in FIG. 7) is positioned to face an inner space of the pressure adjusting vessel 705. The pressure adjusting vessel 705 is constructed to be able to adjust a pressure in the inner space.

Numeral 709 denotes an exposure light source. A light emitted from the light source becomes an exposure light 710 through a polarizer 714 and a collimator lens 711. The exposure light 710 illuminates the photomask 701 through a glass window 712 of the pressure adjusting vessel 705. The polarizer 714 has an axis of polarization set such that the direction of the electrical field of the light having passed the polarizer 714 is parallel two rows of first slit openings formed in the photomask 701.

A target subjected to the exposure is prepared by forming a resist 707 on the surface of a substrate 706. A composite of the resist 707 and the substrate 706 is mounted on a stage 708. The stage 708 is driven to move for relative positioning between the substrate 706 and the near-field photomask 701 in two-dimensional directions within a mask plane. Then, the stage 708 is driven to move in the direction normal to the mask plane, causing the near-field photomask 701 and the resist 707 on the substrate 706 to move to a position such that the gap between the front surface of the near-field photomask 701 and the surface of the resist 707 is not larger than 100 nm all over the interface.

Subsequently, the exposure light 710 emitted from the exposure light source 709 is introduced to the pressure adjusting vessel 705 through the glass window 712 and illuminates the near-field exposure photomask 701 from the rear side (upper side in FIG. 7). The resist 707 is thereby exposed to a near-field light projecting through the micro-opening pattern 704 formed in the metal thin film 703 that is formed on the mask base 702 on the front side of the near-field exposure photomask 701.

The resist 707 can be made of a material selected from among photoresist materials used in ordinary semiconductor processes. The wavelength of light capable of exposing the photoresist materials is approximately in the range of 200 to 500 nm. Selecting those photoresist materials that are sensitive to the g-line and the i-line, particularly in the range of 350 to 450 nm, is advantageous in that, because those photoresist materials are available in various types at a relatively low cost, the flexibility in process design is increased and the production cost can be reduced.

The resist 707 made of one of those photoresist materials has a specific exposure sensitivity Eth (=threshold for the exposure) that depends on the film thickness and the wavelength of the exposure light. The resist 707 is exposed by being illuminated with light having an intensity of not lower than the exposure sensitivity Eth. In the near-field optical exposure apparatus of the present invention, as described later in detail, the resist 707 preferably has a film thickness of not larger than 100 nm. When the above-mentioned photoresist materials are used at a film thickness of not larger than 100 nm, the exposure sensitivity Eth is approximately in the range of 5 to 50 mJ/cm$^2$.

The exposure light source 709 is required to illuminate the resist 707 with light in a wavelength range capable of exposing the resist 707. For example, when one of the above-mentioned photoresist materials sensitive to the g-line and the i-line is selected to form the resist 707, the exposure light source 709 may be constituted by one of a HeCd laser (light wavelength: 325 nm and 442 nm), a GaN-based blue semiconductor laser (light wavelength: shorter than 410 nm), second harmonic (SHG) and third harmonic (THG) lasers among infrared lasers, and a mercury lamp (g-line: 436 nm and i-line: 365 nm).

The intensity of exposure light is regulated by adjusting the driving voltage, the driving current and the illumination time of the exposure light source 709. For example, when a beam of the HeCd laser with a beam diameter of 1 mm and an optical output of 100 mW is enlarged so as to cover an area of 100 mm×100 mm by using a beam expander and a collimator lens, optical power per unit area is 1 mW/cm$^2$. When the thus-obtained light illuminates the resist surface for 10 seconds, the intensity of light exposed to the resist is 10 mJ/cm$^2$. If the intensity of the exposure light exceeds the above-mentioned exposure sensitivity Eth of the resist 707, the exposure of the resist is performed.

In practice, because the light illuminates the resist 707 through the near-field exposure photomask 701, the optical power must be adjusted taking into account the transmittance of the photomask 701.

(Principle of Near-Field Exposure)

The principle of exposure using the near-field light is now described with reference to FIG. 8.

Figure 8:
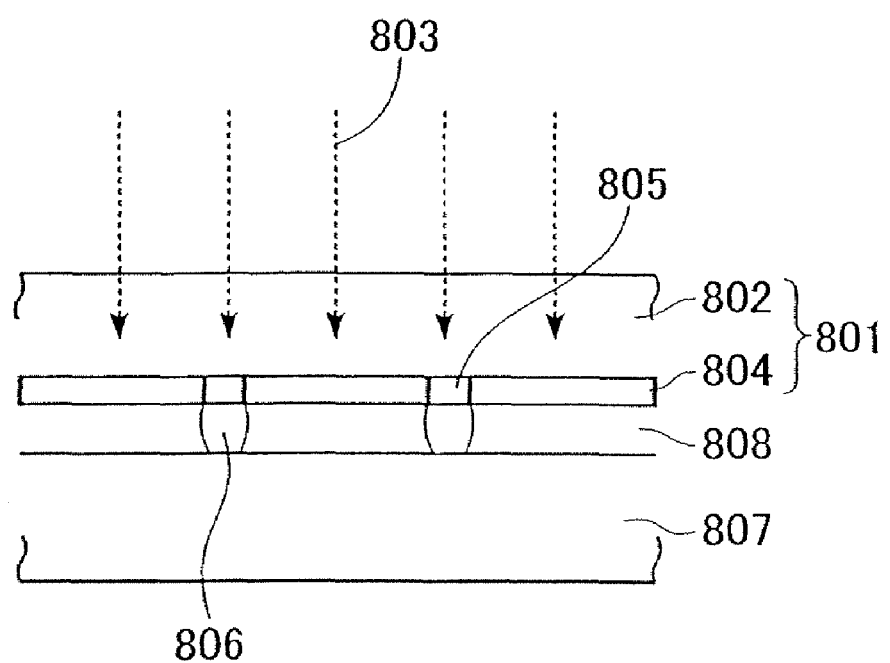
FIG. 8 is an illustration for explaining the principle of near-field exposure.

Referring to FIG. 8, incident light 803 having entered a mask base 802, which constitutes a photomask 801 for use in the near-field exposure, illuminates a micro-opening pattern 805 formed in a metal thin film 804. The opening size (width) of the micro-opening pattern 805 is smaller than the wavelength of the incident light 803 and is not larger than 100 nm.

Usually, light hardly passes through an opening with a size smaller than the wavelength of the light, but a slight amount of light, called a near-field light 806, projects through the opening in the vicinity thereof. The near-field light 806 is a non-propagating light that is generated only in the vicinity of the opening within a distance of not larger than about 100 nm from the opening, and has a property that the intensity of the near-field light is abruptly reduced as the distance from the opening increases.

Then, the surface of a resist 808 formed on a substrate 807 is positioned closer to the micro-opening pattern 805, through which the near-field light 806 projects, within a distance of not larger than about 100 nm from the pattern 805. As a result, the near-field light 806 is scattered in the resist 808 and is converted into propagating light which exposes the resist 808.

Assuming here that the thickness of the metal thin film 804 is about 100 nm, the metal thin film 804 is able to shield almost 100% of transmitted light that results from the incident light 803 directly passing through an area of the metal thin film 804 other than an area in which the micro-opening pattern 805 is formed. Thus, the metal thin film 804 is able to prevent the surface of the resist 808 from being exposed in an area other than an area positioned to face the area of the metal thin film 804 in which the micro-opening pattern 805 is formed.

To form a pattern having a smaller line width, however, the opening width of the micro-opening pattern 805 must be reduced, i.e., the aspect ratio of the micro-opening pattern 805 (=thickness of the metal thin film 804/the opening width of the micro-opening pattern 805) must be increased.

In the above-described exposure method using the near-field light 806 projecting through the micro-opening pattern 805, as the opening width of the micro-opening pattern 805 decreases, the intensity of the near-field light 806 is reduced. Also, assuming the opening width to be the same, as the thickness of the metal thin film 804 increases, the intensity of the near-field light 806 is reduced. This result is attributable to the fact that the longer a passage having a width smaller than the wavelength of light, the harder it is for the near-field light 806 to project through the micro-opening pattern 805. For those reasons, the required exposure time is increased as the opening width of the micro-opening pattern 805 decreases.

Further, reducing the opening width of the micro-opening pattern 805 increases the aspect ratio and hence requires a highly advanced technique for manufacturing the near-field exposure photomask 801, thus resulting in a reduction in the yield.

If the film thickness of the resist 808 is sufficiently small, scattered near-field light 806 in the resist 808 is prevented from spreading in the planar (horizontal) direction to a large extent, and a latent image of a micro-pattern defined by the micro-opening pattern 805 with the opening size smaller than the wavelength of the incident light 803 can be transferred to and formed in the resist 808.

After exposing the resist 808 with the near-field light 806 as described above, the substrate 807 is processed by using ordinary semiconductor processes. For example, a micro-pattern defined by the micro-opening pattern 805 is formed on the substrate 807 through steps of developing the resist and carrying out etching.

(Closely Positioning Method)

A method of positioning the near-field photomask and the resist-and-substrate composite close to each other will be described in detail below with reference to FIG. 7.

If the front surface of the photomask 701 for use in the near-field exposure and the surface of the resist 707 are each perfectly flat, both the surfaces can be positioned close to each other over the entire interface.

In practice, however, the photomask surface and the surface of the resist-and-substrate composite inevitably include irregularities and undulations. Accordingly, if the photomask and the resist are merely brought into a closely positioned or a contact state, there is a risk that a contact area and a non-contact area coexist between them.

To avoid such a risk, a pressure is applied in the direction from the rear side to the front side of the near-field exposure photomask 701, thereby causing the near-field exposure photomask 701 to flex with an elastic deformation. The photomask 701 is thus pressed against the composite of the resist 707 and the substrate 706 so that they can be positioned close to each other over their entire surfaces.

As one example of the method of applying pressure, the near-field exposure photomask 701 is disposed, as shown in FIG. 7, such that the front side of the photomask 701 is positioned outside the pressure adjusting vessel 705 and the rear side thereof is positioned to face the inner space of the pressure adjusting vessel 705. Then, a high pressure gas is introduced into the inner space of the pressure adjusting vessel 705 by using a pressure adjusting unit 713, e.g., a pump, so as to create a higher pressure in the pressure adjusting vessel 705 than the atmospheric pressure.

As another example, the inner space of the pressure adjusting vessel 705 may be filled with a liquid transparent to the exposure light 710, and the pressure of the liquid within the pressure adjusting vessel 705 may be adjusted by using a cylinder.

By introducing the high pressure gas to the inner space of the pressure adjusting vessel 705 with the pressure adjusting unit 713 and increasing the pressure in the pressure adjusting vessel 705, the front surface of the near-field photomask 701 and the surface of the resist 707 on the substrate 706 can be positioned close to each other over the entirety thereof under a uniform pressure.

By applying pressure in such a manner, repulsive forces acting between the front surface of the near-field photomask 701 and the surface of the resist 707 on the substrate 706 become uniform on the basis of the Pascal's principle. This results in the advantage that large forces are avoided from being locally applied to both the surface of the near-field photomask 701 and the surface of the resist 707 on the substrate 706, and hence, the near-field photomask 701, the substrate 706 and the resist 707 are prevented from being locally broken.

In this respect, by adjusting the pressure in the pressure adjusting vessel 705, the pressing forces acting between the near-field photomask 701 and the composite of the resist 707 and the substrate 706, i.e., the contact forces between them, can be controlled. For example, in the case in which the surfaces of the photomask, the resist and the substrate include relatively large sized irregularities and undulations, by setting the pressure in the pressure adjusting vessel 705 to a higher value, it is possible to increase the contact forces and to eliminate variations in the gap between the surface of the near-field photomask and the surface of the resist-and-substrate composite, which are caused by irregularities and undulations in the respective surfaces.

In this embodiment, a description has been provided of the example in which the rear side of the near-field photomask is arranged to be positioned inside the pressurized vessel, thus applying pressure from the rear side to the front side of the near-field photomask based on a pressure difference produced between the pressure in the pressurized vessel and the atmospheric pressure at a relatively lower level so that the near-field photomask and the composite of the resist and the substrate are positioned close to each other. Conversely, the front side of the near-field photomask and the resist-and-substrate composite may be arranged to be positioned inside a depressurized vessel, thus applying a pressure from the rear side to the front side of the near-field photomask based on a pressure difference produced between the pressure in the depressurized vessel and the atmospheric pressure at a relatively higher level.

(Peeling-Off Method)

Peeling-off of the near-field photomask from the composite of the resist and the substrate after the completion of the near-field exposure is carried out as follows.

The pressure in the pressure adjusting vessel 705 is reduced to a level lower than the atmospheric pressure by using the pressure adjusting unit 713. The resulting pressure difference causes the surface of the metal thin film 703 on the near-field photomask 701 to peel off from the surface of the resist 707 on the substrate 706.

When peeling off the near-field photomask 701 from the composite of the resist 707 and the substrate 706 by reducing the pressure as described above, attraction forces acting between the front surface of the near-field photomask 701 and the surface of the resist 707 on the substrate 706 become uniform on the basis of the Pascal's principle. This results in the advantage that large forces are avoided from being locally applied to the surface of the near-field photomask 701 and the surface of the resist 707 on the substrate 706, and hence, the near-field photomask 701, the substrate 706 and the resist 707 are prevented from being locally broken.

In this respect, by adjusting the pressure in the pressure adjusting vessel 705, the forces attracting the near-field photomask 701 away from the composite of the resist 707 and the substrate 706, i.e., the tensile forces for separating them, can be controlled. For example, in the case in which the contact forces between both the surface of the photomask and the surface of the resist-and-substrate composite are large, by setting the pressure in the pressure adjusting vessel 705 to a lower level, it is possible to increase the tensile forces and to more easily peel off the near-field photomask from the resist-and-substrate composite.

As mentioned above, the apparatus for applying pressure in the step of positioning the near-field photomask and the resist-and-substrate composite close to each other may be constructed in a different manner than the construction shown in FIG. 7, such that the front side of the near-field photomask and the resist-and-substrate composite may be both arranged to a position inside a depressurized vessel, thus applying a pressure from the rear side to the front side of the near-field photomask based on a pressure difference between the pressure in the depressurized vessel and the atmospheric pressure at a relatively higher level. In that case, the pressure in the depressurized vessel is set to a level higher than the atmospheric pressure in the peeling-off step.

In any case, the peeling-off step can be performed by producing a pressure difference such that the rear side of the near-field photomask is subjected to a lower pressure than the front side thereof.

(Mask Manufacturing Method)

A method of manufacturing the near-field photomask of the present invention will be described in detail below with reference to FIGS. 9A to 9E.

Figure 9A:
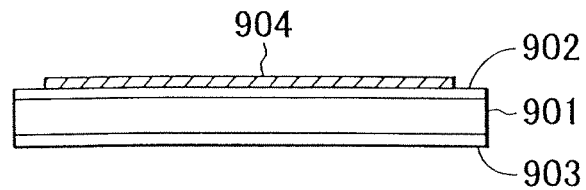
FIGS. 9A to 9E are schematic views for explaining a method of manufacturing the near-field photomask.

As shown in FIG. 9A, a $Si_3N_4$ film 902 serving as a mask base and a $Si_3N_4$ film 903 for forming an etching window therein are each formed by the LP-CVD method at a film thickness of 2 μm, respectively, on a front surface (upper surface in FIG. 9) and a rear surface (lower surface in FIG. 9) of a Si(100)-substrate 901 with a thickness of 500 μm, both the front and rear surfaces being polished. Then, a Cr thin film 904 is formed, as a metal thin film for forming a micro-opening pattern therein, by the vapor deposition method at a film thickness of 50 nm over the $Si_3N_4$ film 902 on the front surface under control with a film thickness monitor using a quartz oscillator.

Figure 9B:
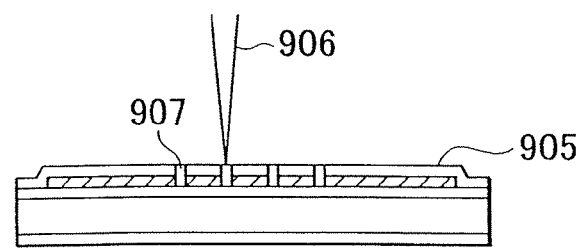

Then, a resist 905 sensitive to an electron ray is coated on the front surface, and a drawing pattern 907 is formed at a width of 10 nm by using an electron ray beam 906 (FIG. 9B). After developing the resist 905, the substrate is subjected to dry etching to form a micro-opening pattern 908 in the Cr thin film 904 (FIG. 9C).

Figure 9C:
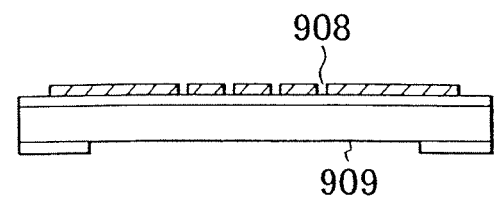
Figure 9D:
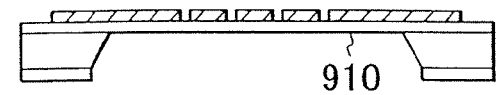

Subsequently, an etching window 909 is formed in the $Si_3N_4$ film 903 on the rear side (FIG. 9C). Anisotropic etching is performed on the rear side of the Si substrate 901 by using KOH, thereby obtaining a mask 910 in the form of a thin film (FIG. 9D).

Figure 9E:
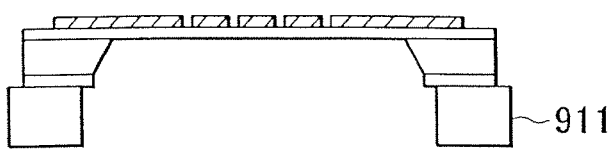
Figure 10:
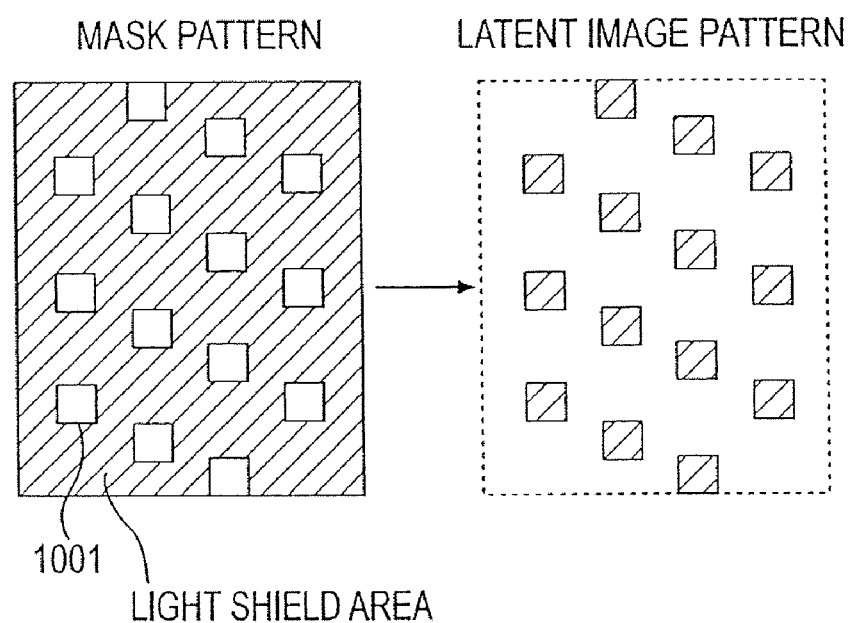
FIG. 10 is an illustration for explaining a near-field photomask of the prior art.

Finally, the mask 910 is bonded to a mask support member 911 to obtain a near-field photomask (FIG. 9E).

In this embodiment, a description has been provided of an example in which the micromachining method with an electron ray is employed in the step of forming the micro-opening pattern 908 in the Cr thin film 904. However, a converged ion beam machining method, an X-ray lithography method, or a scanned probe microscope (SPM) machining method may be used instead of the electron ray machining method. Above all, by forming the micro-opening pattern with the machining method based on the SPM technology represented by a scanned tunnel microscope (STM), an atomic force microscope (AFM), and a scanning near-field optical microscope (SNOM), a submicro-opening pattern with an opening size of not larger than 10 nm can be formed. Thus, the SPM technology is also a micromachining method very suitable in implementing the present invention.

(Exposure Method)

This embodiment has been described in connection with the example in which the mask base is formed as a thin film and is elastically deformed so that the entire surface of the photomask is positioned close to the resist surface following a surface shape of the resist.

The concept of the present invention is not limited to the above-mentioned embodiment, but it is also applicable to the case of using a mask base which is not in the form of a thin film and has rigidity. This case, however, accompanies a risk that the closeness between the photomask surface and the resist surface over the entire interface may deteriorate from a satisfactory level.

Also, if the surface of the metal thin film 602 on the side positioned close to the resist-and-substrate composite is not flat, there is a risk that the photomask is not positioned satisfactorily close to the resist-and-substrate composite, and hence a variation in exposure may occur.

For that reason, it is desired that the surface of the metal thin film 602 be highly flat with irregularities reduced to the order of not larger than 100 nm, and, preferably, not larger than 10 nm.

The opening width of the micro-opening pattern is set to be smaller than the wavelength of the light for use in the exposure and equal to a desired pattern width of the exposure performed on the resist. More specifically, the opening width of the micro-opening pattern is preferably selected from the range of 1 to 100 nm. If the opening width of the micro-opening pattern is not smaller than 100 nm, an undesired result would occur in that not only would the near-field light intended in the present invention, but also the direct propagating light of higher intensity would pass through the photomask. On the other hand, if the opening width of the micro-opening pattern is not larger than 1 nm, it would be not practical, though the exposure is feasible, because the intensity of the near-field light protruded through the photomask is very small and a longer time is required for the exposure.

While the opening width of the micro-opening pattern is required to be not larger than 100 nm, as described above, the length of the opening in the lengthwise direction has no limitations and a free pattern shape can be selected. The micro-opening pattern can be a key-shaped pattern, by way of example, as shown in FIG. 6A. Alternatively, it may be an S-shaped pattern (though not shown).

The substrate 706 employed as a workpiece in the near-field exposure apparatus of the present invention can be selected from among a variety of substrates, such as semiconductor substrates made of Si, GaAs, InP, etc., insulating substrates made of glass, quartz, BN, etc., and substrates obtained by forming films of metals, oxides, nitrides, etc., on those substrates.

In the near-field exposure apparatus of the present invention, it is desired that the photomask 701 for use in the near-field exposure and the composite of the resist 707 and the substrate 706 be positioned close to each other to such an extent that the gap between them is held to be not larger than 100 nm, and, preferably, not larger than 10 nm, over the entire exposure region. The substrate selected for practical use is desirably as flat as possible.

Similarly, it is desired that the surface of the resist 707 used in the present invention be flat and have very small irregularities. Also, because the light projecting through the near-field photomask 701 attenuates exponentially as the distance from the photomask increases, it is hard for the near-field light to expose the resist 707 up to a depth of not less than 100 nm, and the near-field light tends to spread in the resist while scattering, thereby increasing the exposure pattern width. In consideration of those properties of the near-field light, it is desired that the thickness of the resist 707 be not larger than at least 100 nm, and, preferably, be as thin as possible.

Thus, the resist material coating method is advantageously selected to be capable of forming the resist such that the film thickness of the resist is not larger than at least 100 nm, preferably, not larger than 10 nm, and that the resist surface is very flat and has irregularities with sizes of not larger than at least 100 nm, preferably not larger than 10 nm.

As an alternative method of satisfying those conditions, the resist material may be dissolved in a solvent so as to have a lower viscosity, and then spin-coated on the substrate at a very small and uniform thickness.

As still another resist material coating method, the LB (Langmuir Blodgett) method may also be used in which an accumulated film made up of monolayers is formed on a substrate by scooping, onto the substrate, a monolayer a predetermined number of times, which is obtained by arranging amphiphilic resist material molecules on the water surface, each of the molecules containing a hydrophobic group and a hydrophilic function group.

Furthermore, a SAM (Self Assembled Monolayer) forming method may be used instead in which a monolayer of a photoresist material is formed on a substrate by depositing only a single molecular layer with physical adsorption or chemical coupling on the substrate in a solution or a gas phase.

Of the coating methods described above, the LB method and the SAM method are able to form a very thin resist film at a uniform thickness and high surface flatness. They are, therefore, resist material coating methods highly suitable for use with the near-field exposure apparatus of the present invention.

In the near-field exposure, it is desired that the gap between the near-field photomask 701 and the composite of the resist 707 and the substrate 706 be not larger than 100 nm and be held uniform without variations over the entire exposure region.

It is, therefore, not preferable that a pattern having irregularities already formed in another lithographic process be present on a substrate used in the near-field exposure, and that the substrate surface has irregularities with sizes of not larger than 100 nm.

In other words, the substrate used in the near-field exposure is preferably one which has not been subjected to other various processes, i.e., it is in an initial process stage and is as flat as possible. Accordingly, when the near-field exposure process is combined with other lithography processes, the near-field exposure process is desirably carried out in a stage as early as possible.

Further, in FIG. 8, the intensity of the near-field light 806 projecting through the micro-opening pattern 805 on the near-field photomask 801 differs depending on the opening size of the micro-opening pattern 805. Therefore, if the micro-openings have different sizes from each other, the intensity of exposure performed on the resist 808 also varies, and a uniform pattern is difficult to form.

To avoid such variations in opening size, it is desired that the micro-opening pattern formed in the near-field photomask used in each step of the near-field exposure process has a uniform opening width.

The above description has been provided to describe an apparatus in which the near-field photomask covering the entire substrate surface is employed, and the near-field exposure is performed over the entire substrate surface at one time. The concept of the present invention is not limited to that type of apparatus, but it is also applicable to a step-and-repeat apparatus in which the near-field photomask with a size smaller than the substrate is employed, and the near-field exposure for a part of the substrate is repeated while changing the exposure position on the substrate.

Embodiments

First Embodiment

Figure 2:
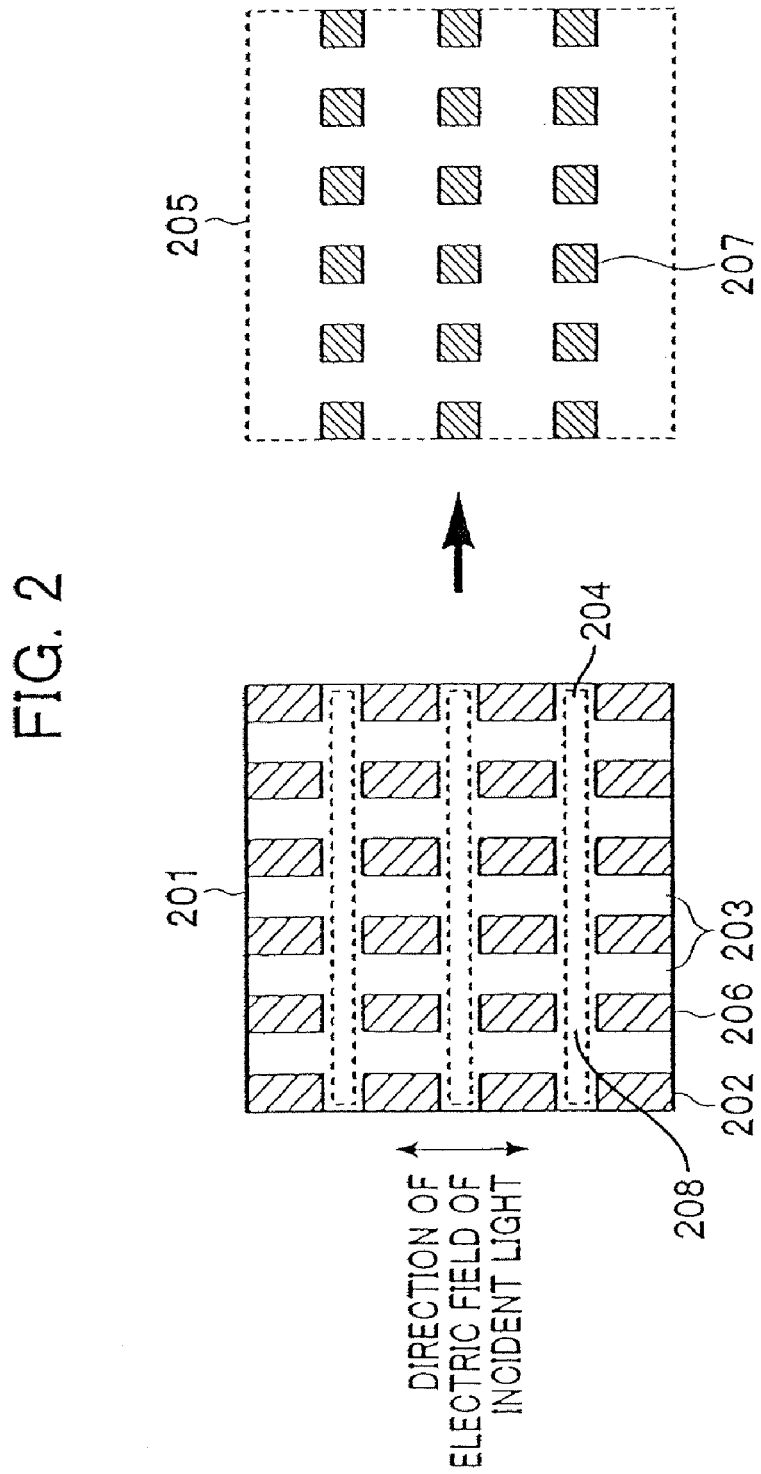
FIG. 2 is an illustration showing a first embodiment of the near-field photomask according to the present invention.

FIG. 2 shows a first embodiment of the opening pattern for the near-field photomask of the present invention.

Referring to FIG. 2, areas 208 where light shield portions 206 and second slit openings 204 in a near-field photomask 201 cross each other are arrayed in a rectangular lattice pattern. By exposing a photoresist with the use of the near-field photomask 201, a latent image pattern is formed as a pattern of dots arrayed in the form of a rectangular lattice, as denoted by reference numeral 205.

The dimensions of the opening pattern formed in the near-field photomask 201 are, by way of example, as follows. A row of first slit openings 203 has a width of 40 nm, and the light shield portion 206 has a width of 20 nm. The second slit opening 204 has a width of 20 nm, the interval between two adjacent second slit openings 204 is 60 nm, and the crossed area 208 has a size of 20 nm×20 nm. In this case, the latent image pattern 205 formed in the photoresist is made up of a plurality of latent-dot-image formed areas 207 each having a size of about 30 nm×30 nm, which are arranged in a two-dimensional array with a pitch of 80 nm in the vertical direction and a pitch of 60 nm in the horizontal direction as viewed in FIG. 2.

Second Embodiment

FIG. 3 shows a second embodiment of the opening pattern for the near-field photomask of the present invention.

Referring to FIG. 3, areas 308 where light shield portions 306 and second slit openings 304 in a near-field photomask 301 cross each other are arrayed in a triangular lattice pattern. By exposing a photoresist with the use of the near-field photomask 301, a latent image pattern is formed in the photoresist as a pattern of dots arrayed in the form of a triangular lattice, as denoted by reference numeral 305.

The dimensions of the opening pattern formed in the near-field photomask 301 are, by way of example, as follows. A row of first slit openings 303 has a width of 40 nm, and the light shield portion 306 has a width of 20 nm. The second slit opening 304 has a width of 20 nm, the interval between two adjacent second slit openings 304 is 60 nm, and the crossed area 308 has a size of 20 nm×20 nm. In this case, the latent image pattern 305 formed in the photoresist is made up of a plurality of latent-dot-image formed areas 307 each having a size of about 30 nm×30 nm, which are arranged in a triangular lattice array with a pitch of 100 nm in the oblique direction and a pitch of 120 nm in the horizontal direction as viewed in FIG. 3.

Third Embodiment

FIG. 4 shows a third embodiment of the opening pattern for the near-field photomask of the present invention.

Referring to FIG. 4, areas 408 where light shield portions 406 and second slit openings 404 in a near-field photomask 401 cross each other are arrayed in a hexagonal lattice pattern. By exposing a photoresist with the use of the near-field photomask 401, a latent image pattern is formed in the photoresist as a pattern of dots arrayed in the form of a hexagonal lattice, as denoted by reference numeral 405.

The dimensions of the opening pattern formed in the near-field photomask 401 are, by way of example, as follows. A row of first slit openings 403 has a width of 40 nm n, and the light shield portion 406 has a width of 20 nm. The second slit opening 404 has a width of 20 nm, the interval between two adjacent second slit openings 404 is 40 nm, and the crossed area 408 has a size of 20 nm×20 nm. In this case, the latent image pattern 405 formed in the photoresist is made up of a plurality of latent-dot-image formed areas 407 each having a size of about 30 nm×30 nm, which are arranged in a hexagonal lattice array with a pitch of 85 nm in the oblique direction and a pitch of 60 nm in the horizontal direction, as viewed in FIG. 4.

Fourth Embodiment

FIG. 5 shows a fourth embodiment of the opening pattern for the near-field photomask of the present invention.

Referring to FIG. 5, areas 508 where light shield portions 506 and second slit openings 504 in a near-field photomask 501 cross each other are arrayed in a random pattern. By exposing a photoresist with the use of the near-field photomask 501, a latent image pattern is formed in the photoresist as a dot pattern corresponding to the pattern of the near-field photomask 501, as denoted by reference numeral 505.

The dimensions of the opening pattern formed in the near-field photomask 501 are, by way of example, as follows. A row of first slit openings 503 has a width of 40 nm, and the light shield portion 506 has a width of 20 to 100 nm. The second slit opening 504 has a width of 20 nm, and the crossed area 508 has a size of 20 nm×20 nm. In this case, the latent image pattern 505 formed in the photoresist is made up of a plurality of latent-dot-image formed areas 507 each having a size of about 30 nm×30 nm, which are arranged in a pattern corresponding to the pattern of the near-field photomask 501.

A description is now provided of examples of a device manufactured with the near-field exposure apparatus employing the near-field photomask of the present invention. The present invention is suitably applied to any type of device so long as the device has a pattern of dots each having a size of not larger than 100 nm. However, devices described below are particularly suitable for implementing the present invention.

Fifth Embodiment

As a first example, the present invention is suitable for forming quantum dots. One practical device is a super-lattice device in which quantum dots each having a size of not larger than 100 nm are periodically arrayed as shown in FIGS. 11A and 11B.

Figure 11A:
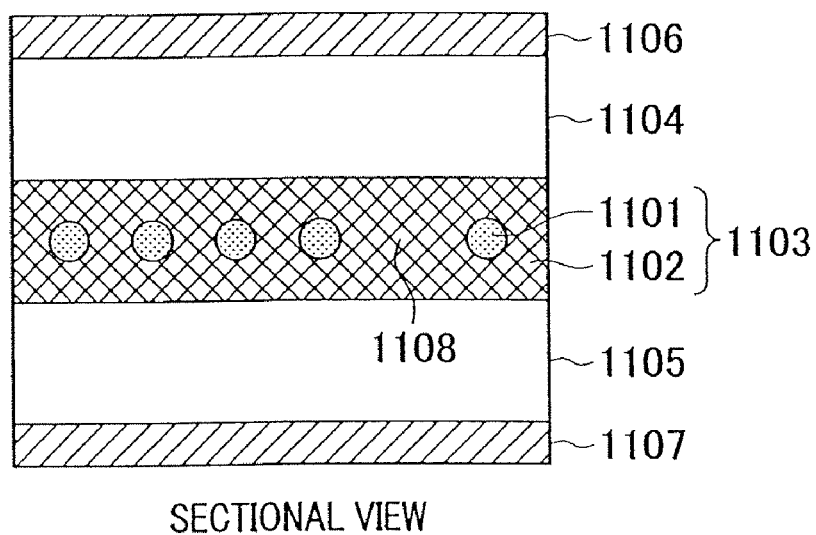
FIGS. 11A and 11B are a sectional view and a plan view, respectively, of an active layer portion showing a construction of a quantum dot super-lattice device manufactured using the exposure apparatus and method of the present invention.
Figure 11B:
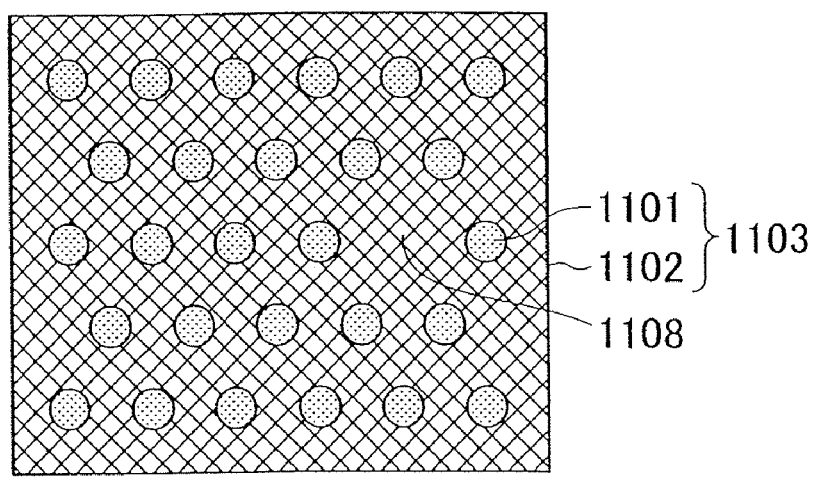

The quantum dot super-lattice device shown in FIGS. 11A and 11B is of a structure that an active layer 1103 formed by burying GaAs quantum dots 1101 in i-type AlGaAs 1102 is sandwiched between an n-type AlAs clad layer 1104 and a p-type AlAs clad layer 1105, and an n-side electrode 1106 and a p-side electrode 1107 are disposed on both sides of the sandwich-like members. Thus, this embodiment shows a light emitting device having luminous efficiency increased with that structure.

A method of manufacturing the quantum dot super-lattice device is as follows. The p-side electrode and the p-type AlAs clad layer are formed on a substrate, and i-type AlGaAs is grown at a predetermined thickness on the p-type AlAs clad layer. Then, a GaAs layer of a predetermined thickness is grown at a predetermined thickness on the i-type AlGaAs. Subsequently, the GaAs layer is patterned into a predetermined two-dimensional dot array through successive processes of photoresist coating, exposure, development and etching by using the exposure apparatus and method of the present invention. GaAs quantum dots are thereby formed. A photomask used herein has a triangular lattice pattern as shown in FIG. 3. Further, an i-type AlGaAs clad layer is grown at a predetermined thickness on the patterned GaAs layer. Thereafter, the n-type AlAs clad layer and the n-side electrode are formed thereon.

Sixth Embodiment

As a second example, the present invention is suitable for manufacturing an optical device having a sub-wavelength structure (SWS). In the sub-wavelength structure, it is required to manufacture micro-structures each having a size not larger than 100 nm over a wide region. One practical example of the optical device is an antireflection structured device, as shown in FIGS. 12A and 12B.

Figure 12A:
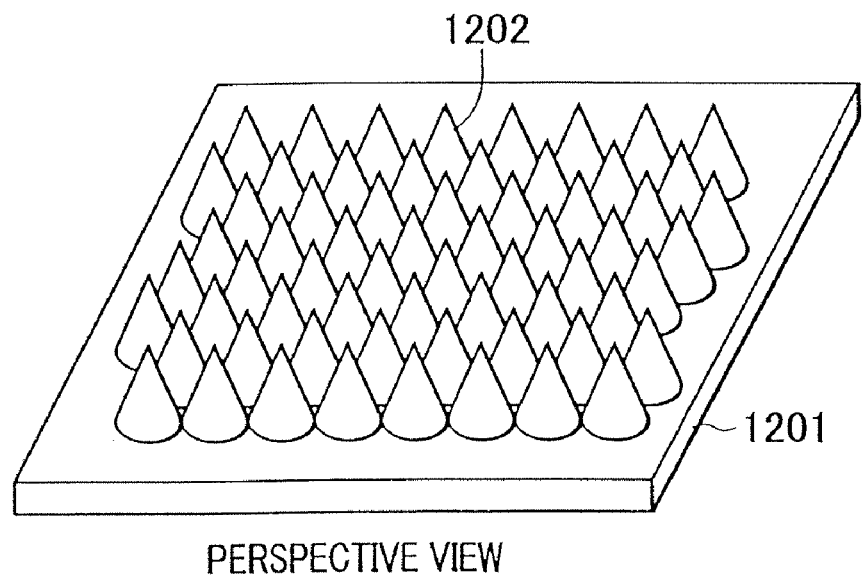
FIGS. 12A and 12B are a perspective view and a sectional view, respectively, showing a construction of a sub-wavelength optical device manufactured using the exposure apparatus and method of the present invention.
Figure 12B:
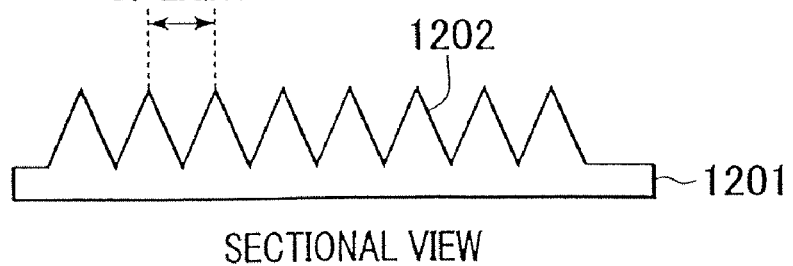

The antireflection structured device shown in FIGS. 12A and 12B is constituted as a two-dimensional array of quartz-made conical structures 1202 formed on a quartz substrate 1201. By setting the pitch of the quartz-made conical structures 1202 to be smaller than the wavelength of light incident upon the substrate, the antireflection structured device exhibits the function of not reflecting the incident light. Also, similar to the first example, the antireflection structured device may be modified to have the function of partly reflecting (scattering) the incident light, as required, by introducing defects in a part of the quartz-made conical structures 1202.

A method of manufacturing the antireflection structured device is as follows. A photoresist is formed on the quartz substrate and patterned into a predetermined two-dimensional dot array through successive processes of negative-type photoresist coating, exposure and development by using the exposure apparatus and method of the present invention. Then, the quartz substrate is etched by using, as a mask, the thus-obtained photoresist pattern in the form of a two-dimensional dot array. As a result, the conical structures each having a pointed apex and gradually spreading toward the foot are formed as shown in FIGS. 12A and 12B.

Seventh Embodiment

As a third example, the present invention is suitable for manufacturing a sensor utilizing localized plasmon. For generating the localized plasmon, i metallic micro-structures, each having a size of not larger than 100 nm over a wide region, must be manufactured. One practical example of such a sensor is a biosensor, shown in FIGS. 13A and 13B, in which light illuminates metallic nano-particles, and an electrical field is enhanced with localized plasmon generated around each of the metallic micro-structures, thereby improving sensitivity of the sensor.

Figure 13A:
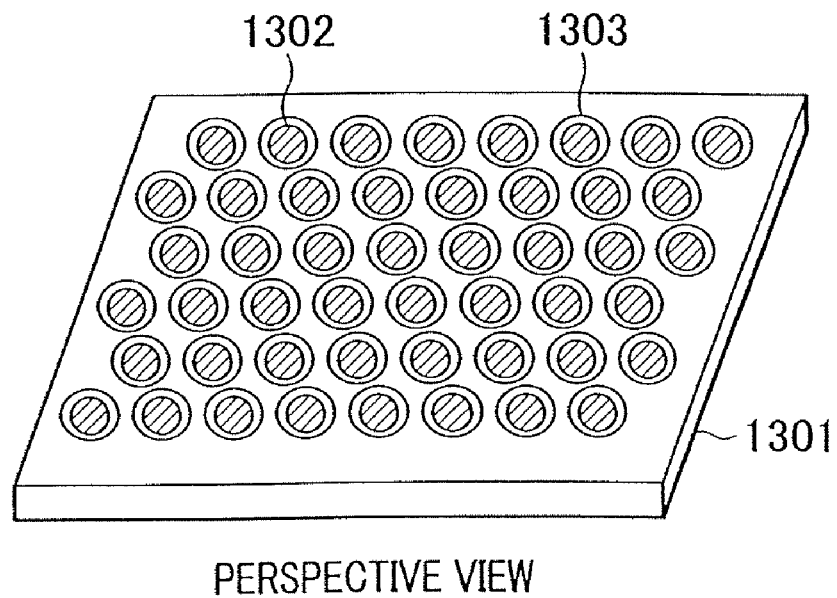
FIGS. 13A and 13B are a perspective view and a sectional view, respectively, showing a construction of a sensor manufactured using the exposure apparatus and method of the present invention.
Figure 13B:
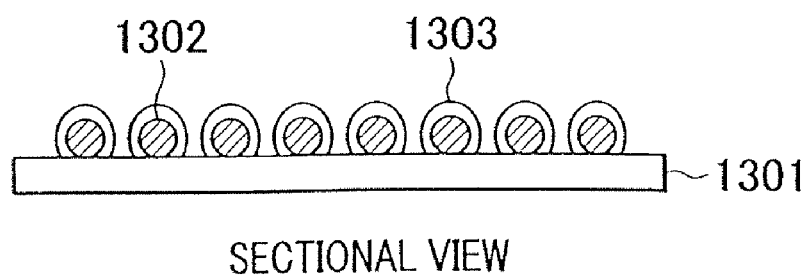

The biosensor shown in FIGS. 13A and 13B is constituted as a two-dimensional array comprising Au nano-particles 1302 formed on a glass substrate 1301 and sensor materials 1303 disposed around the Au nano-particles 1302. By illuminating the biosensor with light for detection, a sensor signal is obtained from a spectrum of the light having passed through the two-dimensional array.

A method of manufacturing the biosensor is as follows. An Au thin film is formed on the glass substrate and patterned into a predetermined two-dimensional dot array through successive processes of photoresist coating, exposure, development and etching by using the exposure apparatus and method of the present invention. An Au nano-particle array is thereby obtained. Then, a sensor material is prepared by introducing a function group, which is capable of coupling with Au, into a material molecule, and is disposed so as to cover the surroundings of each Au nano-particle for coupling with the Au.

Comparing this structure with the structures of a similar device manufactured using the conventional self-assembly method, the structures manufactured using the present invention have higher regularity in period and size, whereby the device performance is improved. Further, local defects can freely be introduced to the structures manufactured as per design so that the device has a specific function.

While the present invention has been described with reference to what are at present considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of manufacturing a device, said method comprising the steps of:
   (i) providing a near-field photomask comprising a light shield film for constituting a light shield portion and openings formed in the light shield film, wherein the openings comprise two or more parallel first slit openings lengthening in a first direction and a second slit opening lengthening in a second direction that is perpendicular to the first direction, wherein the second slit opening interlinks the first slit openings;
   (ii) forming a photoresist layer on a substrate;
   (iii) exposing the photoresist layer to near-field light through the near-field photomask using polarized exposure light having an electrical field component parallel to the first direction to form a latent image in the photoresist only in discrete regions at which the second slit opening crosses the light shield portion;
   (iv) forming a pattern of the photoresist layer based on the latent image; and
   (v) etching a surface of the substrate based on the pattern.

2. A method of manufacturing a device according to claim 1, wherein the pattern is a pattern of dots.

3. A method of manufacturing a device according to claim 1, wherein the device comprises quantum dots.

4. A method of manufacturing a device according to claim 1, wherein the device is an optical device having a sub-wavelength structure.

5. A method of manufacturing a device according to claim 1, wherein the device is a sensor utilizing a localized plasmon.

* * * * *